(12) United States Patent
Kim et al.

(10) Patent No.: US 6,890,822 B2
(45) Date of Patent: May 10, 2005

(54) SEMICONDUCTOR DEVICE HAVING MULTIPLE GATE OXIDE LAYERS AND METHOD OF MANUFACTURING THEREOF

(75) Inventors: Inki Kim, Seoul (KR); Sang Yeon Kim, Chungcheng-bukdo (KR); Min Paek, Heungduck-gu Chongju (KR); Ong Boon Teong, Darulaman (MY); Oh Choong Young, Seoul (KR); Ng Chun Leng, Penang (MY); Joung Joon Ho, Seoul (KR)

(73) Assignee: SilTerra Malaysia Sdn. Bhd., Kedah (MY)

( * ) Notice: Subject to any disclaimer, the term of this patent is extended or adjusted under 35 U.S.C. 154(b) by 267 days.

(21) Appl. No.: 10/367,591

(22) Filed: Feb. 13, 2003

(65) Prior Publication Data

US 2004/0161897 A1 Aug. 19, 2004

(51) Int. Cl.$^7$ ............................................ H01L 21/8234
(52) U.S. Cl. ........................ 438/275; 438/981; 438/763
(58) Field of Search ......................... 438/275, 761–763, 438/981

(56) References Cited

U.S. PATENT DOCUMENTS

| | | | | |
|---|---|---|---|---|
| 5,480,828 A | * | 1/1996 | Hsu et al. ................... | 438/275 |
| 5,672,521 A | * | 9/1997 | Barsan et al. ............... | 438/276 |
| 6,133,164 A | * | 10/2000 | Kim ........................... | 438/275 |
| 6,258,673 B1 | * | 7/2001 | Houlihan et al. ........... | 438/275 |
| 6,399,448 B1 | * | 6/2002 | Mukhopadhyay et al. .. | 438/275 |

* cited by examiner

Primary Examiner—Richard A. Booth
(74) Attorney, Agent, or Firm—Townsend and Townsend and Crew LLP

(57) ABSTRACT

A method of manufacturing a semiconductor device includes defining a first voltage region, a second voltage region, and a third voltage region on a substrate. The first, second, and third voltage regions are configured to handle first, second, and third voltage levels, respectively, that are different from each other. A nitride layer overlying the first, second, and third voltage regions are formed. An oxide layer overlying the nitride layer is formed. The oxide layer is patterned to expose a portion of the nitride layer overlying the first voltage region. The exposed portion of the nitride layer is removed using a wet etch process. A first gate oxide layer overlying the first voltage region is formed. Portions of the oxide layer and the nitride layer overlying the second and third voltage regions are removed. Impurities are selectively implanted into the third voltage region while preventing the impurities from being provided in the second voltage region. A second gate oxide overlying the second voltage region and a third gate oxide overlying the third voltage region are formed simultaneously. The second gate oxide is thicker than the third gate oxide.

14 Claims, 3 Drawing Sheets

SEMICONDUCTOR DEVICE HAVING MULTIPLE GATE OXIDE LAYERS AND METHOD OF MANUFACTURING THEREOF

BACKGROUND OF THE INVENTION

The invention relates to a semiconductor device having gate oxides of different thicknesses.

As the size of semiconductor devices, i.e., the channel length of integrated circuit devices, are scaled down, the thickness of the gate oxide layer is also decreased correspondingly. Semiconductor technology has advanced to a point where some devices have very thin gate oxides, e.g., about 60 Angstroms, where high density VLSI circuits are required.

Within such devices, the transistors with very thin gate oxides need to be operated with low voltage, e.g., about 3 volts or less, in order to prevent damages to the gate oxides. This low voltage limitation may not adequate for the input/output (I/O) requirements of the integrated circuit.

Many MOS devices external to the high density integrated circuit operate in a 5 volt regime. In fact, some semiconductor devices requires an even higher voltage, e.g., about 21 volts or more, as a power source or for operation of peripheral circuits. These MOS devices are provided with a longer channel length and thicker gate oxide layer for optimal performance. Accordingly, an effective method of providing gate oxides of different thicknesses is needed for semiconductor devices that are configured to handle two or more voltage levels.

BRIEF SUMMARY OF THE INVENTION

In one embodiment, a method of manufacturing a semiconductor device includes defining a first voltage region, a second voltage region, and a third voltage region on a substrate. The first, second, and third voltage regions are configured to handle first, second, and third voltage levels, respectively, that are different from each other. A nitride layer overlying the first, second, and third voltage regions are formed. An oxide layer overlying the nitride layer is formed. The oxide layer is patterned to expose a portion of the nitride layer overlying the first voltage region. The exposed portion of the nitride layer is removed using a wet etch process. A first gate oxide layer overlying the first voltage region is formed. Portions of the oxide layer and the nitride layer overlying the second and third voltage regions are removed. Impurities are selectively implanted into the third voltage region while preventing the impurities from being provided in the second voltage region. A second gate oxide overlying the second voltage region and a third gate oxide overlying the third voltage region are formed simultaneously. The second gate oxide is thicker than the third gate oxide.

DETAILED DESCRIPTION OF THE INVENTION

The embodiments of the present invention relates to fabricating a semiconductor device configured to handle a plurality of different voltages, e.g., three different voltage levels.

Figure 1:
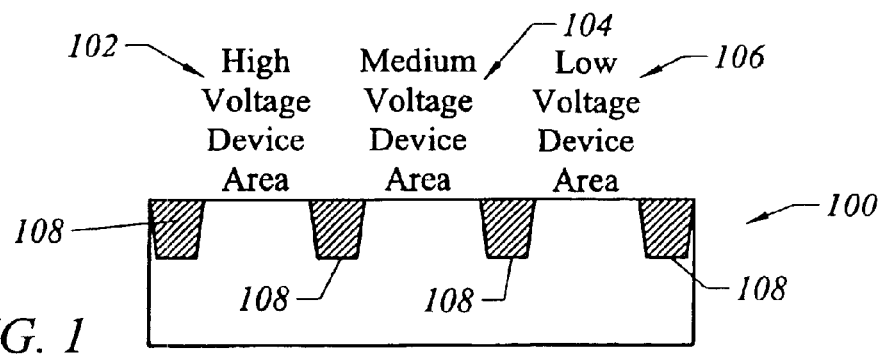
FIGS. 1–7 illustrate a method of forming multiple gate oxides on a substrate using impurities provided in a given voltage region according to embodiments of the present invention.

FIG. 1 illustrates a semiconductor substrate 100 having a high voltage area 102, a medium voltage area 104, and a low voltage area 106 according to one embodiment of the present invention. A semiconductor device having multiple gate oxides is fabricated using the substrate 100. The substrate 100 is a silicon substrate in the present embodiment. The areas or regions 102–106 are separated by a plurality of isolation structures 108, e.g., a shallow trench isolations.

In one embodiment, the high voltage area 102 is configured to handle about 21 volts or more, and the medium voltage area 104 is configured to handle about 5 volts, and the low voltage area 106 is configured to handle about 2.5 volts or 3.3 volts. Accordingly, the high voltage region 102 is provided with a thick gate oxide layer (also referred to as "a first gate oxide"); the medium voltage region 104 is provided with a medium gate oxide (also referred to as "a second gate oxide"); the low voltage region 106 is provided with a thin gate oxide (also referred to as "a third gate oxide"). The terms "first gate oxide," "second gate oxide," and "third gate oxide" are used to refer to the high voltage region, medium voltage region, and low voltage region for purposes of illustrating the present embodiment in the detailed description, and should not be used for interpreting the scope of the invention.

Figure 2:
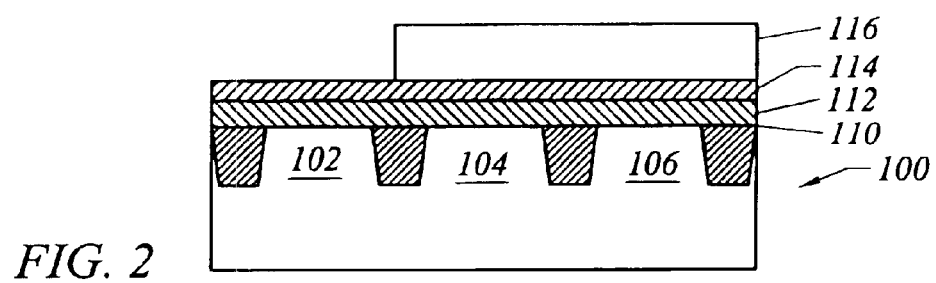

Referring to FIG. 2, a pad oxide layer 110 is formed overlying the silicon substrate 100. The pad oxide layer may be formed by thermal oxidation, rapid thermal oxidation ("RTO"), or by chemical vapor deposition ("CVD"). The pad oxide layer protects the surface of the silicon substrate from being damaged during the subsequent processing steps for forming the gate oxides of different thicknesses. The pad oxide layer 110 is preferably formed as thin as possible for easy removal subsequently, e.g., using a simple pre-gate clean (diluted HF). The oxide layer 110 is formed to a thickness of between about 40 angstroms and 140 angstroms.

A silicon nitride layer 112 is deposited overlying the pad oxide layer 110. The nitride layer 112 is used as a hard mask to etch the pad oxide layer 110 in a subsequent process step. In one embodiment, the silicon nitride layer 112 is deposited by a low-pressure chemical vapor deposition ("LPCVD") process to a thickness of between about 250 angstroms and 450 angstroms.

An oxide layer 114 is deposited overlying the silicon nitride layer 112. The oxide layer 114 is used to provide a hard mask for etching the silicon nitride layer 112 in a subsequent step. The oxide layer 114 is preferably composed of silicon dioxide deposited by LPCVD using a tetraethoxysilane source. The oxide layer 114 is preferably deposited to a thickness of between about 200 angstroms and 400 angstroms.

A photoresist layer 116 is deposited overlying the oxide layer 114. The photoresist layer 116 is patterned to uncover a portion of the oxide layer 114 that is overlying the high voltage region 102.

Figure 3:
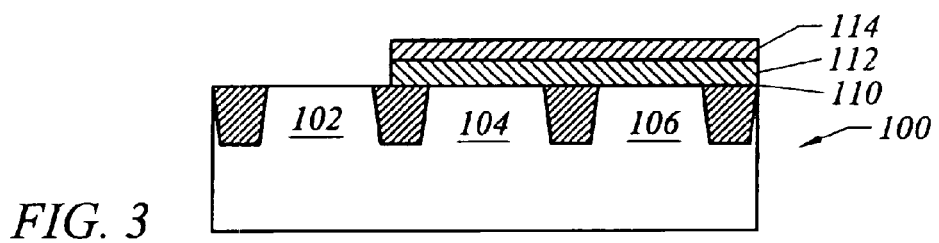

Referring to FIG. 3, the uncovered portion of the oxide layer 114 is patterned to expose a portion of the nitride layer 114 overlying the high voltage region 102. The oxide layer may be patterned using a wet or dry process. In the present embodiment, the oxide layer is patterned by using a wet etch process, e.g., using HF solvent, to avoid residues that may result from a dry etch process. The nitride layer 112 protects the pad oxide layer and the silicon substrate from the wet etch process. Accordingly, the pad oxide layer may be kept to a minimum thickness for easy removal by use of the nitride layer.

The photoresist layer 116 is stripped away using either a plasma strip (ashing) or a chemical wet strip. The silicon nitride layer 112 protects the pad oxide layer 110 and the silicon substrate 100 during the photoresist stripping process.

The exposed portion of the silicon nitride layer 112 is etched using a wet etch process to prevent formation of etch residues as a result of a dry etch process according to one embodiment of the present invention. For example, a phosphoric acid ($H_3PO_4$). The phosphoric acid has a high etch selectivity, i.e., etches the silicon nitride layer at a much higher rate than the oxide layer. The phosphoric acid accordingly exposes a portion of the pad oxide layer overlying the high voltage region 102.

Figure 4:
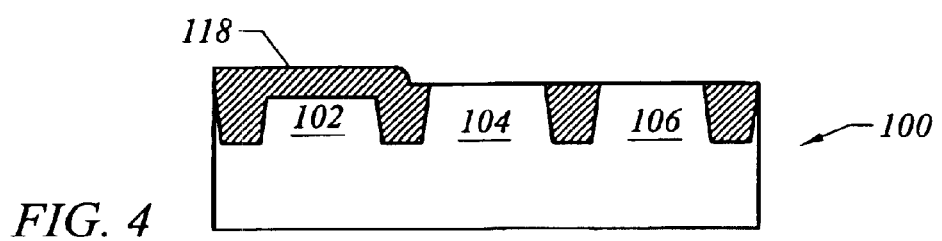

Referring to FIG. 4, the exposed pad oxide layer 110 and the oxide layer 114 are etched away simultaneously according to one embodiment of the present invention. That is, a pre-gate clean process is used to remove both the pad oxide layer 110 and the masking oxide layer 114.

A first gate oxide 118 is grown overlying the silicon substrate 110 in the high voltage region 102. The first gate oxide layer is a high quality oxide. In one embodiment, the thick gate oxide layer 118 is grown to a thickness of between about 600 angstroms and 1200 angstroms. The first gate oxide may be configured to handle about 21 volts, about 32 volts, or about 40 volts according to the present embodiment.

The silicon nitride layer 112 remaining on the medium and low voltage regions 104 and 106 are etched away using a wet etch process. For example, a phosphoric acid is used to selectively remove the remaining silicon nitride layer without etching the first gate oxide 118.

Figure 5:
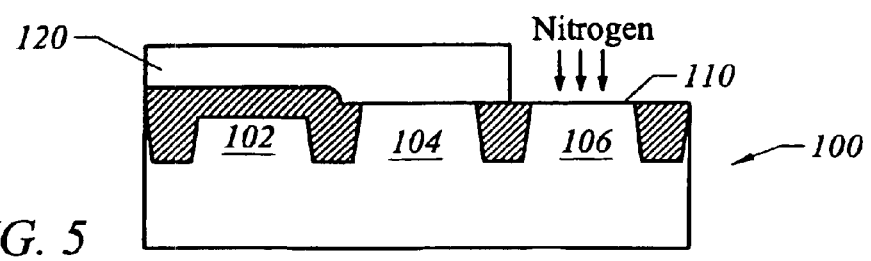

Referring to FIG. 5, a photoresist layer 120 is formed overlying the silicon substrate 110. The photoresist layer 120 is patterned to expose a portion of the pad oxide layer 110 overlying the low voltage region 106.

In one embodiment, nitrogen is implanted into the low voltage region 102. The low voltage region 102 is provided with nitrogen concentration of about $10^{14}/cm^2$. The nitrogen concentration may be about $10^{14}/cm^2$ to about $3.5 \times 10^{14}/cm^2$. The nitrogen is provided in the low voltage region to slow the oxide growth, as will be explained later. In one embodiment, a desired nitrogen concentration is obtained by driving the nitrogen ions into the substrate using a low energy, e.g., about 25 KeV.

Figure 6:
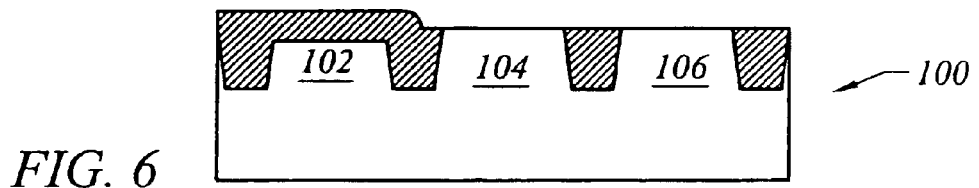

Referring FIG. 6, the photoresist layer 120 is stripped by ashing or wet process. The pad oxide layer 110 overlying the medium and low voltage regions 104 and 106 is etched away.

Figure 7:
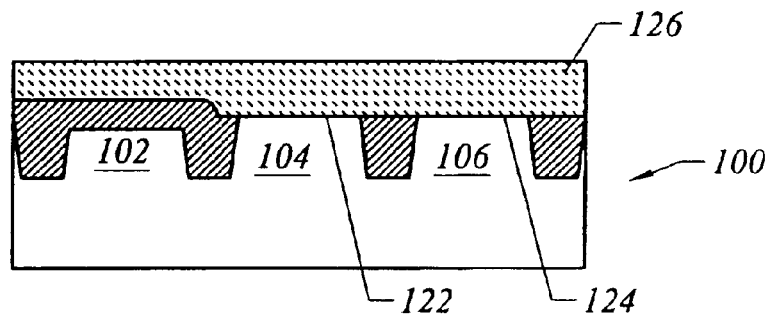

Referring to FIG. 7, an oxide growth step is performed to form a second gate oxide 122 overlying the medium voltage region 104 and a third gate oxide 124 overlying the low voltage region 106. The nitrogen implanted in the low voltage region 106 lowers the oxide growth rate at the low voltage region 106. Accordingly, the third gate oxide 124 is provided to be about 20–30 angstroms less in thickness than the second gate oxide 122. In one embodiment, the second gate oxide is about 34 angstroms to about 60 angstroms, and the third gate oxide is about 50 angstroms to about 100 angstroms.

A polysilicon layer 126 is formed overlying the first, second, and third gate oxides 120, 122, and 124 according to one embodiment of the present invention. The polysilicon is used as gate electrodes for the high, medium, and low voltage regions. Accordingly, the silicon substrate 100 is provided with multiple gate oxides, i.e., the first, second, and third gate oxides, having different thicknesses. A semiconductor device manufactured using the substrate 100 is thereby configured to effectively handles at least three different voltage levels.

Figure 8:
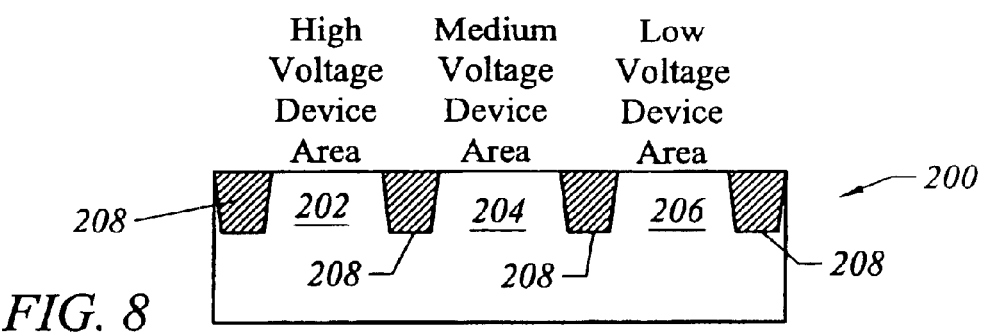
FIGS. 8–14 illustrate a method of forming multiple gate oxides on a substrate by selectively forming gate oxides at high, medium, and low voltage regions according to embodiments of the present invention.

FIG. 8 illustrates a semiconductor substrate 200 having a high voltage area 202, a medium voltage area 204, and a low voltage area 106 according to another embodiment of the present invention. A semiconductor device having multiple gate oxides is fabricated using the substrate 200. The substrate 200 is a silicon substrate in the present embodiment. The areas or regions 202–206 are separated by a plurality of isolation structures 208, e.g., a shallow trench isolations.

In one embodiment, the high voltage area 202 is configured to handle about 21 volts or more, and the medium voltage area 204 is configured to handle about 5 volts, and the low voltage area 206 is configured to handle about 2.5 volts or 3.3 volts. Accordingly, the high voltage region 202 is provided with a thick gate oxide layer (also referred to as "a first gate oxide"); the medium voltage region 104 is provided with a medium gate oxide (also referred to as "a second gate oxide"); the low voltage region 106 is provided with a thin gate oxide (also referred to as "a third gate oxide").

Figure 9:
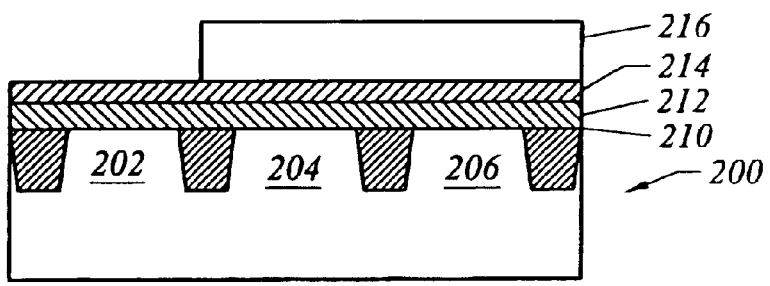

Referring to FIG. 9, a pad oxide layer 210 is formed overlying the silicon substrate 200. The pad oxide layer may be formed by thermal oxidation, or by rapid thermal oxidation ("RTO"). The pad oxide layer protects the surface of the silicon substrate from being damaged during the subsequent processing steps for forming the gate oxides of different thicknesses. The pad oxide layer 210 is preferably formed as thin as possible for easy removal subsequently, e.g., using a simple pre-gate clean (diluted HF). The oxide layer 210 is formed to a thickness of between about 40 angstroms and 140 angstroms.

A silicon nitride layer 212 is deposited overlying the pad oxide layer 210. The nitride layer 212 is used as a hard mask to etch the pad oxide layer 210 in a subsequent process step. In one embodiment, the silicon nitride layer is deposited by a low-pressure chemical vapor deposition ("LPCVD") process to a thickness of between about 250 angstroms and 450 angstroms.

An oxide layer 214 is deposited overlying the silicon nitride layer 212. The oxide layer 214 is used to provide a hard mask for etching the silicon nitride layer 212 in a subsequent step. The oxide layer 214 is preferably composed of silicon dioxide deposited by LPCVD using a tetraethoxysilane source. The oxide layer 214 is preferably deposited to a thickness of between about 200 angstroms and 400 angstroms.

A photoresist layer 216 is deposited overlying the oxide layer 214. The photoresist layer 216 is patterned to uncover a portion of the oxide layer 214 that is overlying the high voltage region 202.

Figure 10:
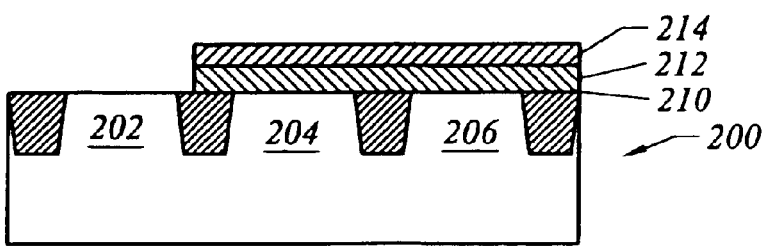

Referring to FIG. 10, the uncovered portion of the oxide layer 214 is patterned to expose a portion of the nitride layer 214 overlying the high voltage region 202. The oxide layer may be patterned using a wet or dry process. In the present embodiment, the oxide layer is patterned by using a wet etch process, e.g., using HF solvent, to avoid residues that may result from a dry etch process. The nitride layer 212 protects the pad oxide layer and the silicon substrate from the wet etch process. Accordingly, the pad oxide layer may be kept to a minimum thickness for easy removal by using the nitride layer.

The photoresist layer 216 is stripped away using either a plasma strip (ashing) or a chemical wet strip. The silicon nitride layer 212 protects the pad oxide layer 210 and the silicon substrate 200 during the photoresist stripping process.

The exposed portion of the silicon nitride layer 212 is etched using a wet etch process to prevent formation of etch residues as a result of a dry etch process according to one embodiment of the present invention. For example, a phosphoric acid ($H_3PO_4$). The phosphoric acid has a high etch selectivity, i.e., etches the silicon nitride layer at a much higher rate than the oxide layer. The phosphoric acid accordingly exposes a portion of the pad oxide layer overlying the high voltage region 202.

Figure 11:
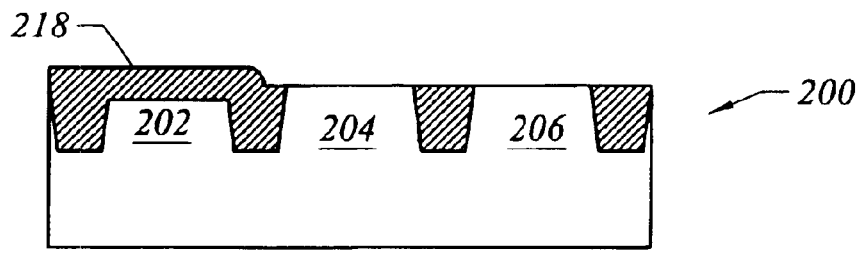

Referring to FIG. 11, the exposed pad oxide layer 210 and the oxide layer 214 are etched away simultaneously according to one embodiment of the present invention. That is, a pre-gate clean process is used to remove both the pad oxide layer 210 and the masking oxide layer 214.

A first gate oxide 218 is grown overlying the silicon substrate 200 in the high voltage region 202. The first gate oxide layer is a high quality oxide. In one embodiment, the thick gate oxide layer 218 is grown to a thickness of between about 600 angstroms and 1200 angstroms.

The silicon nitride layer 212 remaining on the medium and low voltage regions 204 and 206 are etched away using a wet etch process. For example, a phosphoric acid is used to selectively remove the remaining silicon nitride layer without etching the first gate oxide 218.

Figure 12:
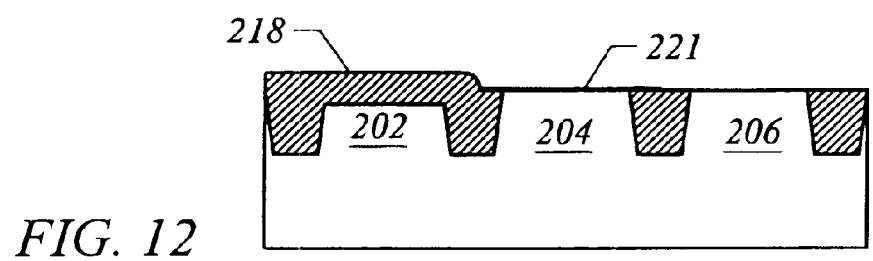

Referring to FIG. 12, the removal of the silicon nitride layer 212 exposes the pad oxide layer 210 remaining over the medium and low voltage regions 204 and 206. This pad oxide is removed using a pre-gate clean process to expose the underlying silicon substrate. An oxide layer 221 is grown overlying the medium and low voltage regions 204 and 206 to a thickness suitable for handling a medium voltage level, e.g., about 5 volts. In one embodiment, the oxide layer 221 is provided with a thickness of about 70 angstroms to about 110 angstroms. Alternatively, the oxide layer may be grown to a thickness suitable for handling a low voltage level, e.g., about 3 volts.

Figure 13:
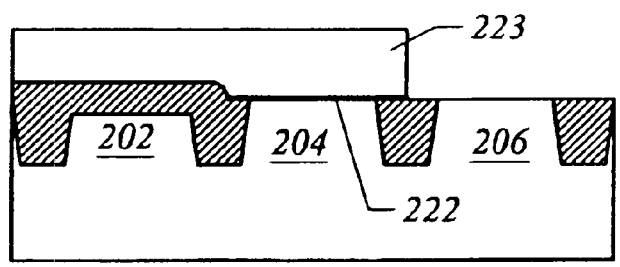

Referring to FIG. 13, a photoresist layer 223 is formed overlying the silicon substrate 200. The photoresist layer 223 is patterned to expose the low voltage region 206 to expose a portion of the oxide layer 221 overlying the low voltage region 206. The exposed portion of the oxide layer 221 is removed using a wet etch process. A HF solvent is used for this purpose according to one embodiment. A dry etching preferably is not used in order to prevent residue problems and damages to the silicon substrate that may result from dry etch processes.

Figure 14:
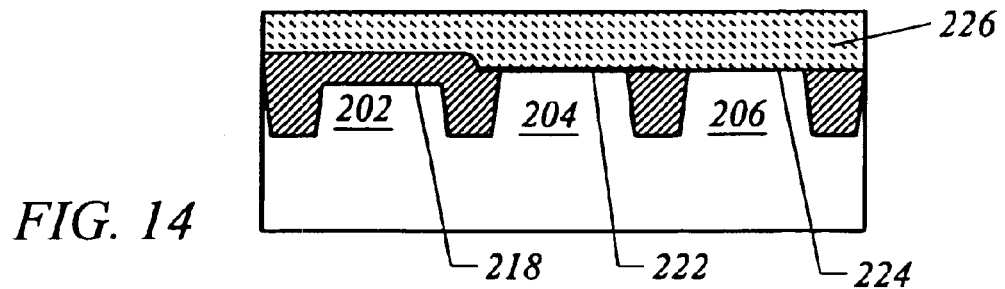

Referring to FIG. 14, the photoresist layer 223 is stripped. The pre-gate oxidation cleaning is performed on the exposed silicon substrate in the low voltage region 206. Thereafter, a third gate oxide 224 is grown in the low voltage region 206 to a suitable thickness to handle a low voltage level. In one embodiment, the third gate oxide is provided with a thickness of about 34 angstroms to about 60 angstroms. The oxide layer 221 in medium voltage region 204 is increased to 100~120 A and is a second gate oxide. A polysilicon layer 226 is formed overlying the high, medium, and low voltage regions 202-206 to serve as a gate electrode. Accordingly, the substrate 200 is provided with three different gate oxides, each with different thicknesses suitable for handling corresponding different voltage levels.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a semiconductor device, comprising:

defining a first voltage region, a second voltage region, and a third voltage region on a substrate, the first, second, and third voltage regions being configured to handle first, second, and third voltage levels, respectively, that are different from each other;

forming a nitride layer overlying the first, second, and third voltage regions;

forming an oxide layer overlying the nitride layer;

patterning the oxide layer to expose a portion of the nitride layer overlying the first voltage region;

removing the exposed portion of the nitride layer using a wet etch process;

forming a first gate oxide layer overlying the first voltage region;

removing portions of the oxide layer and the nitride layer overlying the second and third voltage regions;

selectively implanting impurities into the third voltage region while preventing the impurities from being provided in the second voltage region; and forming a second gate oxide overlying the second voltage region and a third gate oxide overlying the third voltage region simultaneously, the second gate oxide being thicker than the third gate oxide.

2. The method of claim 1, further comprising:

providing a pad oxide layer between the substrate and the nitride layer.

3. The method of claim 2, further comprising:

removing portions of the pad oxide layer overlying the second and third voltage regions to expose the substrate underneath, wherein forming the second and third gate oxides involves growing an oxide layer on the exposed silicon substrate, the impurities provided in the third voltage region of the substrate being used to slow oxide growth in the third voltage region.

4. The method of claim 3, wherein the impurities are nitrogen ions.

5. The method of claim 4, wherein the third voltage region of the substrate is provided with a nitrogen concentration of about $10^{14}/cm^2$ to about $3.5 \times 10^{14}/cm^3$.

6. The method of claim 4, wherein the nitrogen ions are provided in the third voltage region of the substrate using an ion implantation method.

7. The method of claim 6, wherein the nitrogen ions are provided with energy of about 15 KeV to about 35 KeV for implantation into the substrate.

8. The method of claim 1, wherein the oxide layer overlying the nitride layer is removed using a wet etch process.

9. The method of claim 1, wherein the nitride layer is removed using phosphoric acid.

10. The method of claim 1, wherein the first, second, and third voltage regions are high, medium, and low voltage regions, respectively.

11. A method for manufacturing a semiconductor device, comprising:

defining a high voltage region, a medium voltage region, and a low voltage region on a substrate, the high, medium, and low voltage regions being configured to handle high, medium, and low voltage levels, respectively;

forming a nitride layer overlying the high, medium, and low voltage regions;

forming an oxide layer overlying the nitride layer;

patterning the oxide layer to expose a portion of the nitride layer overlying the high voltage region;

removing the exposed portion of the nitride layer using a wet etch process;

forming a first gate oxide layer overlying the high voltage region;

removing portions of the oxide layer and the nitride layer overlying the medium and third voltage regions;

selectively implanting nitrogen ions into the low voltage region while preventing the impurities from being provided in the medium voltage region; and forming a second gate oxide overlying the medium voltage region and a third gate oxide overlying the low voltage region simultaneously, the second gate oxide being thicker than the third gate oxide.

12. The method of claim 11, wherein the low voltage region of the substrate is provided with a nitrogen concentration of about $10^{14}/cm^2$ to about $3.5 \times 10^{14}/cm^3$.

13. The method of claim 12, wherein the nitrogen ions are provided with energy of about 15 KeV to about 35 KeV for implantation into the substrate.

14. The method of claim 13, wherein the oxide layer overlying the nitride layer is removed using a wet etch process.

* * * * *